(12) United States Patent
Ooiwa

(10) Patent No.: US 12,013,712 B2
(45) Date of Patent: Jun. 18, 2024

(54) VOLTAGE GENERATION CIRCUIT AND SEMICONDUCTOR DEVICE

(71) Applicant: KIOXIA CORPORATION, Tokyo (JP)

(72) Inventor: Koji Ooiwa, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/194,686

(22) Filed: Apr. 3, 2023

(65) Prior Publication Data
US 2023/0236618 A1 Jul. 27, 2023

Related U.S. Application Data

(63) Continuation of application No. 17/467,746, filed on Sep. 7, 2021, now Pat. No. 11,681,318.

(30) Foreign Application Priority Data

Mar. 18, 2021 (JP) .................. 2021-045250

(51) Int. Cl.
*G05F 3/24* (2006.01)
*G06F 13/16* (2006.01)
*G11C 16/04* (2006.01)

(52) U.S. Cl.
CPC ............ *G05F 3/24* (2013.01); *G06F 13/1668* (2013.01); *G11C 16/0483* (2013.01)

(58) Field of Classification Search
CPC ..... G05F 3/24; G05F 3/02; G05F 3/08; G05F 3/16; G05F 3/247; G05F 1/561; G06F 13/1668; G11C 16/0483; G11C 16/30
See application file for complete search history.

(56) References Cited

U.S. PATENT DOCUMENTS 5,319,345 A * 6/1994 Abe .................. H01C 10/50
338/48
5,343,221 A 8/1994 Arakawa
9,098,102 B2 8/2015 Kadowaki et al.
(Continued)

FOREIGN PATENT DOCUMENTS

JP 6104784 B2 3/2017
JP 2020-119298 A 8/2020
(Continued)

*Primary Examiner* — Jung Kim
(74) *Attorney, Agent, or Firm* — Oblon, McClelland, Maier & Neustadt, L.L.P.

(57) ABSTRACT

A voltage generation circuit includes a voltage dividing circuit configured to divide applied voltage; a bias circuit configured to generate voltage by dividing power source voltage supplied through a first input terminal; and a power source switching control circuit configured to perform first processing of preventing voltage supply from a power source line to the voltage dividing circuit, connecting the power source line to a first output terminal, and connecting a ground to a second output terminal, second processing of connecting the power source line and the ground to the voltage dividing circuit, and third processing of obtaining voltage through the voltage dividing circuit by supplying voltage generated by the bias circuit to the first output terminal and supplying the voltage generated by the bias circuit to the voltage dividing circuit.

6 Claims, 7 Drawing Sheets

(56) References Cited

U.S. PATENT DOCUMENTS

| | | |
|---|---|---|
| 10,168,723 B2 | 1/2019 | Kang |
| 10,826,526 B2 | 11/2020 | Nakanishi et al. |
| 10,910,068 B2 | 2/2021 | Takizawa et al. |
| 2007/0200616 A1 | 8/2007 | Shin |
| 2020/0244458 A1 | 7/2020 | Kanbe |
| 2020/0301611 A1 | 9/2020 | Sia et al. |
| 2020/0301847 A1 | 9/2020 | Miura |
| 2021/0021280 A1 | 1/2021 | Nakanishi et al. |

FOREIGN PATENT DOCUMENTS

| | | |
|---|---|---|
| JP | 2020-154525 A | 9/2020 |
| JP | 2020-154603 A | 9/2020 |
| JP | 2020-154759 A | 9/2020 |
| JP | 2020-155163 A | 9/2020 |

\* cited by examiner

VOLTAGE GENERATION CIRCUIT AND SEMICONDUCTOR DEVICE

CROSS-REFERENCE TO RELATED APPLICATION

This application is a continuation of and claims benefit under 35 U.S.C. § 120 to U.S. application Ser. No. 17/467,746 filed Sep. 7, 2021, now U.S. Pat. No. 11,681,318, which is based upon and claims the benefit of priority under 35 U.S.C. § 119 from Japanese Patent Application No. 2021-045250, filed Mar. 18, 2021, the entire contents of each of which are incorporated herein by reference.

FIELD

An embodiment described herein relates generally to a voltage generation circuit and a semiconductor device.

BACKGROUND

Recently, miniaturization and capacity enlargement have been sought for semiconductor storage devices such as NAND non-volatile memories through three-dimensional structuring. In such semiconductor storage devices, multiple power sources are employed to meet a request for low power consumption or the like, and power source voltage supplied from a host to a memory controller does not match element breakdown voltage in some cases.

Some interface circuits between such devices include a voltage generation circuit configured to generate bias voltage with the element breakdown voltage taken into account, and thus have a tolerant function to avoid an excessive load on the element.

However, it is impossible to protect the element from an excessive load in some cases, depending on a relation between power source voltage supplied from outside to the interface circuit and element breakdown voltage, and a constraint condition such as a power state of the interface circuit.

DETAILED DESCRIPTION

A voltage generation circuit of an embodiment includes: a voltage dividing circuit configured to generate first bias voltage of a first voltage value and second bias voltage of a second voltage value by dividing applied voltage, and output the first bias voltage to a first output terminal and the second bias voltage to a second output terminal; a bias circuit configured to generate voltage by dividing power source voltage supplied through a first input terminal; and a power source switching control circuit configured to perform, when power source voltage corresponding to element breakdown voltage is supplied to a power source line, first processing of stopping voltage supply from the power source line to the voltage dividing circuit and connecting the power source line to the first output terminal and connecting a reference voltage point to the second output terminal, perform, when power source voltage that potentially exceeds the element breakdown voltage is supplied to the power source line, second processing of connecting the power source line and the reference voltage point to the voltage dividing circuit, and perform, when the power source voltage is not supplied to the power source line but is supplied through the first input terminal, third processing of obtaining the second bias voltage through the voltage dividing circuit by supplying the voltage generated by the bias circuit to the first output terminal as the first bias voltage and supplying the voltage generated by the bias circuit to the voltage dividing circuit.

An embodiment of the present invention will be described below in detail with reference to the accompanying drawings.

A voltage generation circuit of the present embodiment can reliably protect an element from power source voltage supplied to an interface circuit by providing a path that conducts or does not conduct electricity in accordance with constraints of the supplied power source voltage. Note that the present embodiment describes an example in which the voltage generation circuit is applied to an interface circuit in a memory system, but the voltage generation circuit may be applied to another interface circuit or may be applied to a circuit other than an interface circuit.

Configuration of Memory System

Figure 1:
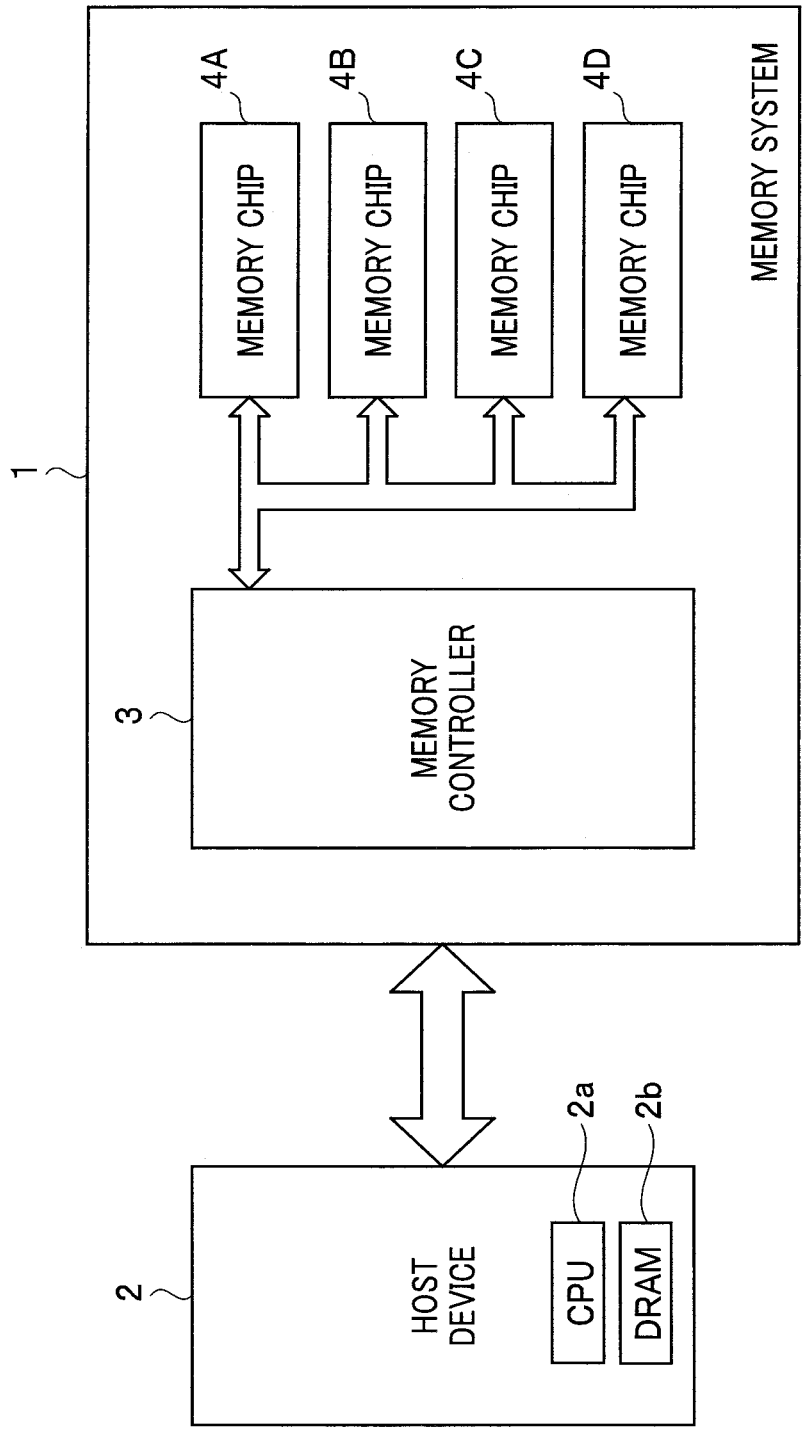
FIG. 1 is a block diagram illustrating a memory system including a voltage generation circuit according to the present embodiment.
Figure 2:
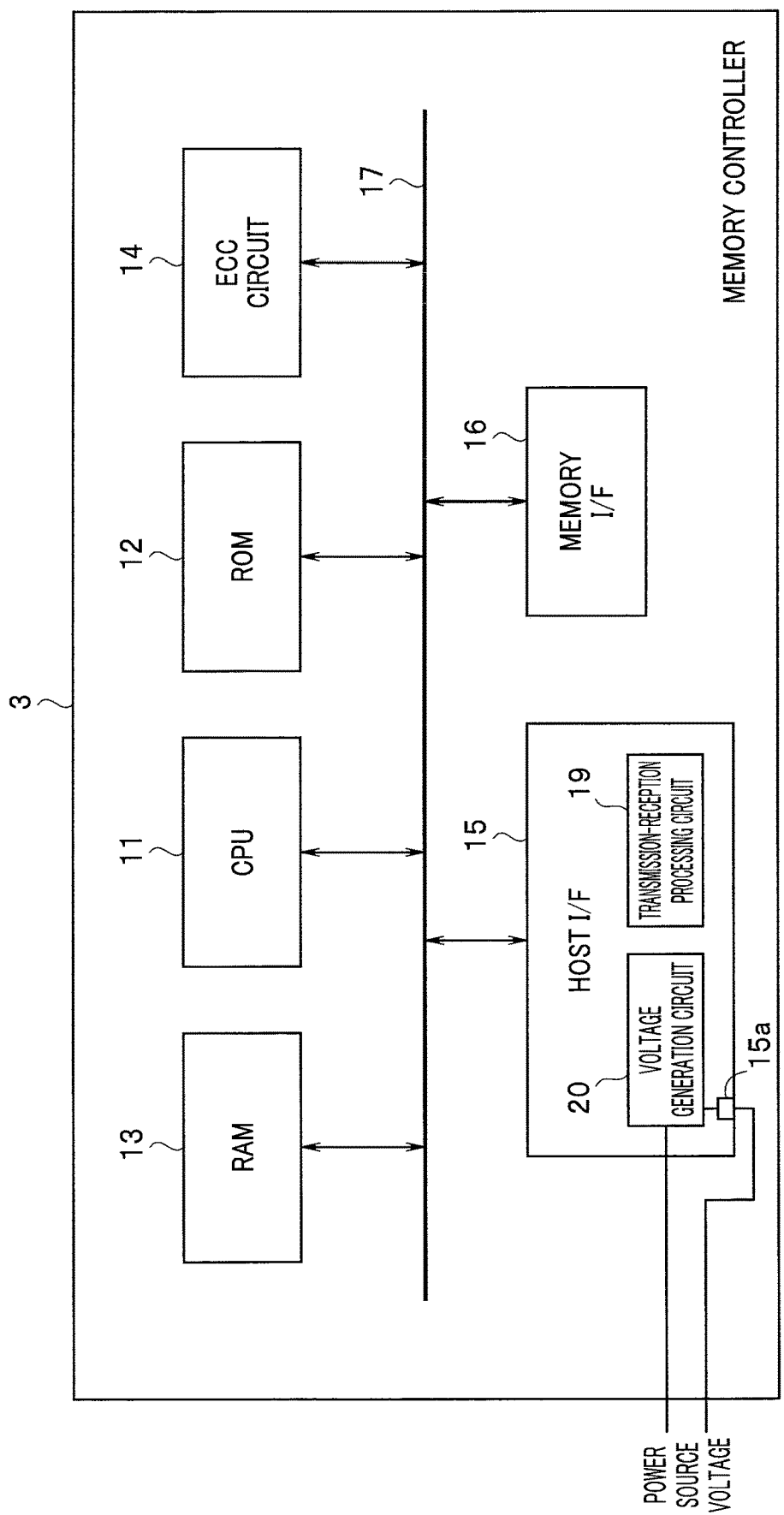
FIG. 2 is a block diagram illustrating an example of a specific configuration of a memory controller in FIG. 1.

FIG. 1 is a block diagram illustrating a memory system including the voltage generation circuit according to the present embodiment. FIG. 2 is a block diagram illustrating an example of a specific configuration of a memory controller in FIG. 1.

A memory system 1 of the present embodiment includes a memory controller 3 and four memory chips 4A to 4D (hereinafter, the four memory chips 4A to 4D are collectively referred to as the memory chips 4 when not need to be distinguished). Note that the number of memory chips 4 is not limited to four, but memory chips in any number equal to or larger than one may be employed.

The memory system 1 is connectable with a host 2. The host 2 is an electronic device such as a personal computer, a portable terminal, an on-board device, or a server. The host 2 includes a central processing unit (CPU) 2a as a processor, a ROM (not illustrated), and a DRAM 2b. In accordance with a request from the host 2, the memory system 1 stores user data (hereinafter simply referred to as data) from the host 2 in each memory chip 4, or reads data stored in each memory chip 4 and outputs the read data to the host 2. More specifically, the memory system 1 can write data to each memory chip 4 in accordance with a writing request from the host 2, and can read data from each memory chip 4 in accordance with a reading request from the host 2.

The memory system 1 may be a UFS (universal flash storage) device or the like in which the memory controller 3 and a plurality of memory chips 4 are configured as one package or may be an SSD (solid state drive) or the like. FIG. 1 illustrates a state in which the memory system 1 is connected with the host 2.

Each memory chip 4 is a semiconductor storage device configured as, for example, a NAND flash memory configured to store data in a non-volatile manner. As illustrated in FIG. 1, the memory controller 3 and each memory chip 4 are connected with each other through a NAND bus. The memory controller 3 controls data writing to the memory chip 4 in accordance with a writing request from the host 2. The memory controller 3 controls data reading from the memory chip 4 in accordance with a reading request from the host 2. The memory controller 3 controls, not in response to a request from the host 2 but autonomously, data writing to and reading from the memory chip 4 in some cases.

In FIG. 2, the memory controller 3 includes a CPU 11, a ROM 12, a RAM (random access memory) 13, an ECC (error check and correct) circuit 14, a host interface (I/F) circuit 15, and a memory I/F circuit 16. The CPU 11, the ROM 12, the RAM 13, the ECC circuit 14, the host I/F circuit 15, and the memory I/F circuit 16 are connected with each other through an internal bus 17.

The host I/F circuit 15 includes a transmission-reception processing circuit 19 configured to perform transmission-reception processing and a voltage generation circuit 20 according to the present embodiment. The transmission-reception processing circuit 19 receives data from the host 2 and outputs a request, write data, and the like included in the received data to the internal bus 17. The transmission-reception processing circuit 19 of the host I/F circuit 15 transmits data read from each memory chip 4, a response from the CPU 11, and the like to the host 2. Note that the host 2 includes an I/F circuit including a non-illustrated transmission-reception processing circuit corresponding to the transmission-reception processing circuit 19 of the host I/F circuit 15.

The voltage generation circuit 20 is supplied with power source voltage from the host 2 and generates bias voltage to be used in the transmission-reception processing circuit 19 of the host I/F circuit 15. Note that the host I/F circuit 15 includes a terminal 15a as a first terminal. The power source voltage from the host 2 is input into the host I/F circuit 15 through the terminal 15a in some cases even when the power source of the host I/F circuit 15 is off. In the present embodiment, the voltage generation circuit 20 generates bias voltage that does not exceed breakdown voltage of each element included in the host I/F circuit 15, and supplies the generated bias voltage to each component in the host I/F circuit 15 as described later.

The host 2 and the host I/F circuit 15 are connected with each other through a predetermined interface. Examples of the interface include various interfaces such as a parallel interface of an eMMC (embedded multimedia card), a serial extension interface of PCIe (peripheral component interconnect express), and an M-PHY high-speed serial interface.

The memory I/F circuit 16 controls, based on an instruction from the CPU 11, processing of writing user data or the like to each memory chip 4 and processing of reading user data or the like from each memory chip 4.

The CPU 11 collectively controls the memory controller 3. The CPU 11 is, for example, a CPU (central processing unit) or an MPU (micro processing unit). When having received a request from the host through the host I/F circuit 15, the CPU 11 performs control in accordance with the request. For example, in accordance with a request from the host, the CPU 11 instructs the memory I/F circuit 16 to write user data to each memory chip 4. In addition, in accordance with a request from the host, the CPU 11 instructs the memory I/F circuit 16 to read user data from each memory chip 4.

The CPU 11 determines, for user data to be stored in the RAM 13, a storage region (hereinafter referred to as a memory region) on each memory chip 4. The user data is stored in the RAM 13 through the internal bus 17. The CPU 11 performs the memory region determination, for example, for data per page as a unit of writing, that is, page data.

The CPU 11 determines a memory region on each memory chip 4 at a writing destination. A physical address is allocated to each memory region on each memory chip 4. The CPU 11 manages a memory region at a data writing destination by using the physical address of the memory region. The CPU 11 specifies the physical address of the determined memory region and instructs the memory I/F circuit 16 to write user data to the memory chip 4. The CPU 11 manages a correspondence between a logical address (logical address managed by the host) of user data and a physical address at which the user data is written. When having received a reading request including a logical address from the host, the CPU 11 identifies a physical address corresponding to the logical address and instructs user data reading to the memory I/F circuit 16 with specification of the physical address.

The ECC circuit 14 generates a code word by encoding user data stored in the RAM 13. The ECC circuit 14 decodes a code word read from each memory chip 4.

The RAM 13 temporarily stores user data received from the host until the user data is stored in each memory chip 4, and temporarily stores data read from each memory chip 4 until the data is transmitted to the host. The RAM 13 is a general-purpose memory such as a SRAM (static random access memory) or a DRAM (dynamic random access memory).

FIG. 2 illustrates a configuration example in which the memory controller 3 includes both the ECC circuit 14 and the memory I/F circuit 16. However, the ECC circuit 14 may be built in the memory I/F circuit 16. Alternatively, the ECC circuit 14 may be built in each memory chip 4.

When having received a writing request from the host 2, the memory controller 3 operates as follows. The CPU 11 causes the RAM 13 to temporarily store write data. The CPU 11 reads the data stored in the RAM 13 and inputs the read data to the ECC circuit 14. The ECC circuit 14 encodes the input data and provides a code word to the memory I/F circuit 16. The memory I/F circuit 16 writes the input code word to each memory chip 4.

When having received a reading request from the host 2, the memory controller 3 operates as follows. The memory I/F circuit 16 provides a code word read from each memory chip 4 to the ECC circuit 14. The ECC circuit 14 decodes the input code word and stores decoded data in the RAM 13. The CPU 11 transmits the data stored in the RAM 13 to the host 2 through the host I/F circuit 15.

Constraint Conditions of Bias Voltage

The present embodiment assumes a first constraint condition that it is not fixed which of a plurality of kinds of power source voltage is supplied from the host 2 to the host I/F circuit 15 and it is not fixed to which power source voltage each element in the host I/F circuit 15 corresponds. The present embodiment also assumes a second constraint condition that power source voltage is applied from the host 2 to the terminal 15a of the host I/F circuit 15 in some cases even when the power source of the host I/F circuit 15 is off. In the present embodiment, it is possible to reliably protect elements even under the first and second constraint conditions.

For example, it is assumed that either of two kinds of voltages, namely, voltage VioH and voltage VioL (VioH>VioL) (hereinafter, these voltages are referred to as voltage Vio when not distinguished) is supplied as power source voltage from the host 2 to the host I/F circuit 15. It is also assumed that the elements in the host I/F circuit 15 include an element (hereinafter referred to as a VioH breakdown voltage element) having breakdown voltage equal to the voltage VioH and an element (hereinafter referred to as a VioL breakdown voltage element) having breakdown voltage equal to the voltage VioL. Under the first constraint condition, for example, the voltage VioH is supplied as power source voltage in some cases even when the host I/F circuit 15 includes the VioL breakdown voltage element. Under the second constraint condition, voltage is applied to the terminal 15a of the host I/F circuit 15 in some cases when the power source of the host I/F circuit 15 is off. For example, when the first constraint condition exists, it is conceivable that the elements in the host I/F circuit 15 include the VioL breakdown voltage element and the voltage VioH is applied to the terminal 15a.

The voltage generation circuit 20 generates high-level bias voltage VbiasH and low-level bias voltage VbiasL as bias voltage Vbias (VbiasH>VbiasL). Under the first constraint condition, the voltage generation circuit 20 generates the bias voltage Vbias by performing two pieces of processing below, thereby achieving a tolerant function.

(1) When the voltage VioL is input (when voltage equivalent to the element breakdown voltage is supplied as power source voltage), the voltage VioL is generated as the bias voltage VbiasH, and a ground level, which is reference voltage, is generated as the bias voltage VbiasL.

(2) When the voltage VioH is input (when voltage that exceeds the element breakdown voltage is potentially supplied as power source voltage), the bias voltages VbiasH and VbiasL that do not exceed the element breakdown voltage are generated by resistively dividing voltage between the voltage VioH and the ground level.

Under the second constraint condition, the voltage generation circuit 20 performs processing below, thereby achieving a tolerant function.

(3) When the voltage Vio is input to the terminal 15a (at original power source voltage cutoff), voltage that exceeds the breakdown voltage is prevented from being applied to each element in the host I/F circuit 15.

Figure 3:
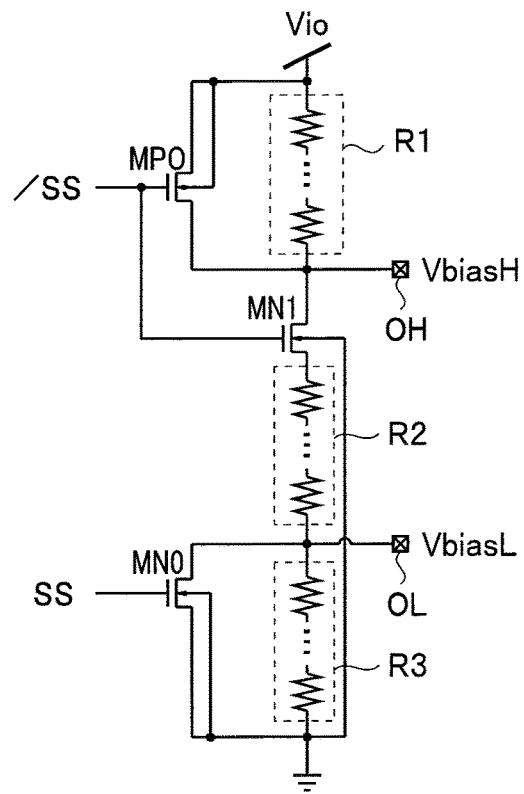
FIG. 3 is a circuit diagram illustrating a comparative example of a voltage generation circuit having a tolerant function for a first constraint condition.

FIG. 3 is a circuit diagram illustrating a comparative example of a voltage generation circuit having a tolerant function for the above-described first constraint condition.

A resistance circuit R1, a current path of an NMOS transistor MN1, a resistance circuit R2, and a resistance circuit R3 are connected in series between a power source line through which the voltage Vio as first power source voltage is supplied (hereinafter simply referred to as a power source line) and a ground as second power source voltage. The resistance circuit R1 is constituted by a plurality of resistors connected in series between the power source line through which the voltage Vio is supplied and a drain of the transistor MN1. The resistance circuit R2 is constituted by a plurality of resistors connected in series between a source of the transistor MN1 and the resistance circuit R3. The resistance circuit R3 is constituted by a plurality of resistors connected in series between the resistance circuit R2 and the ground. The transistor MN1 has a source connected with one end of the resistance circuit has a back gate connected with the ground, and has a gate to which a power source switching inversion signal /SS is supplied.

A PMOS transistor MP0 has a source and a back gate connected with the power source line, the source being connected with a connection point between the resistance circuit R1 and the drain of the transistor MN1, and has a gate to which the power source switching inversion signal /SS is supplied. The connection point between the resistance circuit R1 and the drain of the transistor MN1 is connected with an output terminal OH. Voltage that appears at the output terminal OH is used as the bias voltage VbiasH.

An NMOS transistor MN0 has a source and a back gate connected with the ground, has a drain connected with a connection point between the resistance circuits R2 and R3, and has a gate to which a power source switching signal SS is supplied. The connection point between the resistance circuits R2 and R3 is connected with an output terminal OL. Voltage that appears at the output terminal OL is used as the bias voltage VbiasL.

The power source switching signal SS is at a low level (hereinafter referred to as "L" level) when the voltage VioH is supplied to the power source line as the voltage Vio, and is at a high level (hereinafter referred to as "H" level) when the voltage VioL is supplied to the power source line as the voltage Vio. The power source switching inversion signal /SS is an inversion signal of the power source switching signal SS.

In the comparative example of the voltage generation circuit configured as described above, the transistors MP0 and MN0 are simultaneously turned on and simultaneously turned off. Consider a case in which the voltage VioL is supplied to the power source line (case of (1) described above). In this case, the power source switching inversion signal /SS is at the "L" level, and the power source switching signal SS is at the "H" level. Thus, the transistors MP0 and MN0 are both on. The transistor MN1 is off. Thus, the voltage VioL at the power source line is transferred to the output terminal OH through a current path of the transistor MP0. In this manner, the voltage VioL is used as the bias voltage VbiasH.

Since the transistor MN0 is on, the output terminal OL is connected with the ground through the transistor MN0, and the bias voltage VbiasL at the ground level appears at the output terminal OL. Accordingly, the processing described above in (1) is performed.

Consider a case in which the voltage VioH is supplied to the power source line (case of (2) described above). In this case, the power source switching inversion signal /SS is at the "H" level, and the power source switching signal SS is at the "L" level. Thus, the transistors MP0 and MN0 are both off. The transistor MN1 is on.

Thus, the power source line and the ground are connected with each other through the resistance circuit R1, the current path of the transistor MN1, the resistance circuit R2, and the resistance circuit R3. Accordingly, the voltage VioL is divided by each resistor of the resistance circuit R1, and each resistor of the resistance circuit R2 and the resistance circuit R3. Voltage in accordance with a ratio of a resistance value of the resistance circuit R1 and a resistance value of combined resistance of the resistance circuits R2 and R3 appears at the output terminal OH. The voltage is used as the bias voltage VbiasH. In addition, voltage in accordance with a ratio of a resistance value of combined resistance of the resistance circuits R1 and R2 and a resistance value of the resistance circuit R3 appears at the output terminal OL. The voltage is used as the bias voltage VbiasL. The processing described above in (2) is performed by setting the respective resistance values of the resistance circuits R1 to R3 as appropriate.

In this manner, the voltage generation circuit of the comparative example illustrated in FIG. 3 can achieve a tolerant function under the above-described first constraint condition.

Figure 4:
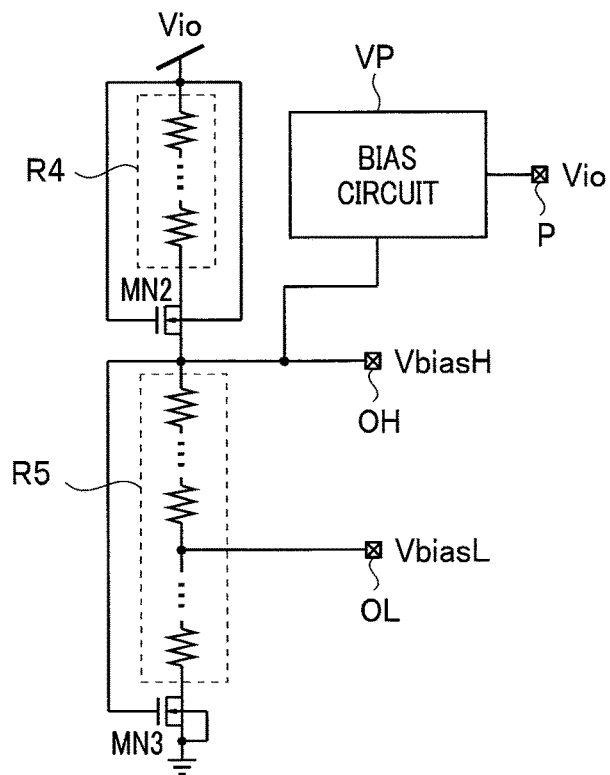
FIG. 4 is a circuit diagram illustrating a comparative example of a voltage generation circuit having a tolerant function for a second constraint condition.

FIG. 4 is a circuit diagram illustrating a comparative example of a voltage generation circuit having a tolerant function for the above-described second constraint condition.

A resistance circuit R4, a current path of an NMOS transistor MN2, a resistance circuit R5, and a current path of an NMOS transistor MN3 are connected in series between the power source line through which the voltage Vio is supplied and the ground as a reference voltage point. The resistance circuit R4 is constituted by a plurality of resistors connected in series between the power source line and a drain of the transistor MN2. The resistance circuit R5 is constituted by a plurality of resistors connected in series between a source of the transistor MN2 and a drain of the transistor MN3.

The transistor MN2 has a gate and a back gate connected with the power source line. The transistor MN3 has a back gate connected with the ground and has a gate connected with a connection point between the source of the transistor MN2 and the resistance circuit R5. The connection point between the source of the transistor MN2 and the resistance circuit R5 is connected with the output terminal OH. Voltage that appears at the output terminal OH is used as the bias voltage VbiasH. A connection point between predetermined resistors among the plurality of resistors of the resistance circuit R5 is connected with the output terminal OL. Voltage that appears at the output terminal OL is used as the bias voltage VbiasL.

The voltage Vio is supplied to a terminal P in some cases even when the voltage Vio is not input to the power source line. The voltage Vio supplied to the terminal P is supplied to a bias circuit VP configured to generate bias voltage from voltage supplied to the terminal P. The bias circuit VP may be configured as, for example, a resistive voltage dividing circuit. The bias circuit VP generates voltage by resistively dividing the voltage Vio and supplies the generated voltage to the connection point between the source of the transistor MN2 and the resistance circuit R5.

In the comparative example of the voltage generation circuit configured as described above, the transistors MN2 and MN3 are both on when the voltage Vio is supplied to the power source line. Thus, the power source line and the ground are connected with each other through the resistance circuit R4, the current path of the transistor MN2, the resistance circuit R5, and the current path of the transistor MN3. Accordingly, the voltage Vio is divided by each resistor of the resistance circuit R4 and each resistor of the resistance circuit R5. Voltage in accordance with a ratio of a resistance value of the resistance circuit R4 and a resistance value of the resistance circuit R5 appears at the output terminal OH. The voltage is used as the bias voltage VbiasH. The voltage at the output terminal OH is divided by resistive division through the resistance circuit R5, and the divided voltage appears at the output terminal OL. The voltage is used as the bias voltage VbiasL.

The transistor MN2 is off when the voltage Vio is not supplied to the power source line but is supplied to the terminal P. The voltage input from the terminal P is resistively divided by the bias circuit VP and supplied to the output terminal OH. The voltage is used as the bias voltage VbiasH. The transistor MN3 is on and the voltage at the output terminal OH is divided by the resistance circuit R5 and appears at the output terminal OL. The voltage is used as the bias voltage VbiasL. The processing described above in (3) is performed by setting the resistance values of the resistance circuits R4 and R5 as appropriate and setting a voltage dividing resistance of the bias circuit VP as appropriate.

In this manner, the voltage generation circuit of the comparative example illustrated in FIG. 4 can achieve a tolerant function under the above-described second constraint condition.

To achieve a tolerant function under both of the first constraint condition and the second constraint condition, it is conceivable to combine the above-described circuits in FIGS. 3 and 4 to configure a voltage generation circuit. However, when the circuits in FIGS. 3 and 4 are combined, a backflow path through which current flows to the power source line is generated by the bias voltage Vbias based on the voltage supplied to the terminal P, and path cutoff of the voltage dividing resistance occurs.

Thus, in the present embodiment, a reliable tolerant function is achieved under the first and second constraint conditions by providing a path for solving a problem of path cutoff of the voltage dividing resistance and a path for preventing current flow to the power source line due to the voltage supplied to the terminal 15a.

Voltage Generation Circuit

Figure 5:
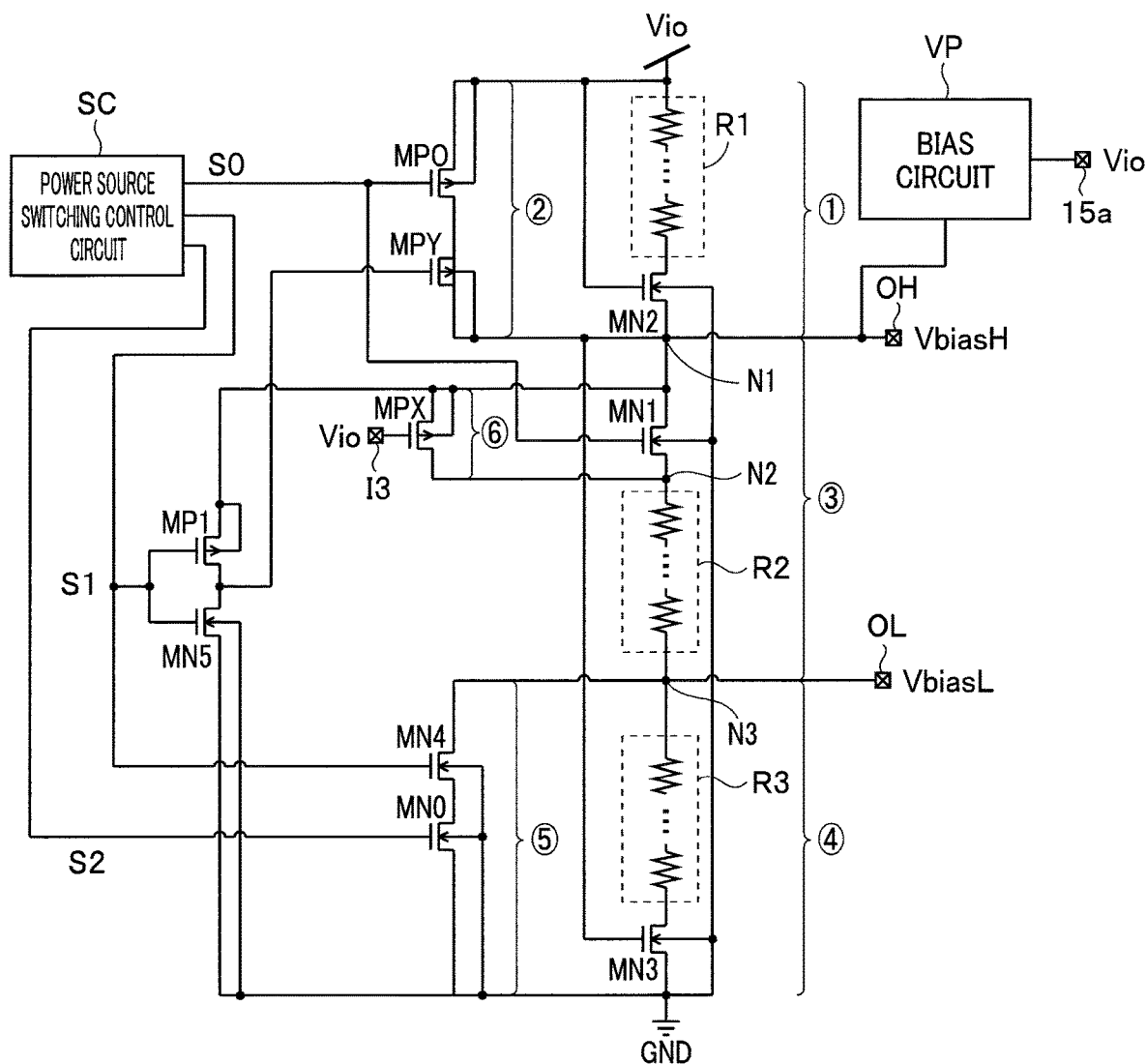
FIG. 5 is a circuit diagram illustrating an example of a specific configuration of a voltage generation circuit 20 in FIG. 2.

FIG. 5 is a circuit diagram illustrating an example of a specific configuration of the voltage generation circuit 20 in FIG. 2. Note that, in FIG. 5, any component same as the component in FIGS. 3 and 4 is denoted by the same reference sign.

The resistance circuit R1, the current path of the NMOS transistor MN2, the current path of the NMOS transistor MN1, the resistance circuit R2, the resistance circuit R3, and the current path of the NMOS transistor MN3 for performing resistive voltage division are connected in series between the power source line through which the voltage Vio is supplied and the ground (GND). A node N1 on a path between the power source line and the ground is connected with the output terminal OH, and a node N3 on the path between the power source line and the ground is connected with the output terminal OL.

In the present embodiment, the resistance circuit R1 and the current path of the transistor MN2 are connected in series on a first path between the power source line and the node N1. In addition, a second path in parallel to the first path is provided between the power source line and the node N1, and the current path of the PMOS transistor MP0 and a current path of a PMOS transistor MPY are connected in series on the second path. Note that circled numbers 1 to 6 in FIG. 5 indicate first to sixth paths.

The resistance circuit R1 is constituted by a plurality of resistors connected in series between the power source line and the drain of the transistor MN2. The transistor MN2 has a drain connected with the resistance circuit R1, has a source connected with the node N1, and has a back gate connected with the ground.

The current path of the transistor MN1 and the resistance circuit R2 are connected in series on a third path between the nodes N1 and N3. The resistance circuit R3 and the current path of the transistor MN3 are connected in series on a fourth path between the node N3 and the ground.

The resistance circuit R2 is constituted by a plurality of resistors connected in series between the source of the transistor MN1 and the node N3. Note that a connection point between the source of the transistor MN1 and the resistance circuit R2 is referred to as a node N2. The resistance circuit R3 is constituted by a plurality of resistors connected in series between the node N3 and the drain of the transistor MN3.

The transistor MN1 has a drain connected with the node N1, has a source connected with the node N2, and has a back gate connected with the ground. A breakdown voltage exceeding determination signal S0 is supplied to the gate of the transistor MN1 from a power source switching control circuit SC to be described later. The transistor MN3 has a drain connected with the resistance circuit R3, has a source and a back gate connected with the ground, and has the gate connected with the node N1.

A fifth path is provided between the node N3 and the ground, and a current path of an NMOS transistor MN4 and a current path of the NMOS transistor MN0 are connected in series on the fifth path.

In the present embodiment, a sixth path is provided between the nodes N1 and N2, and a current path of a PMOS transistor MPX is connected on the sixth path. The voltage generated by the bias circuit VP is supplied to the node N1.

The power source switching control circuit SC generates the breakdown voltage exceeding determination signal S0, a power supply determination signal S1, and a breakdown voltage non-exceeding determination signal S2 in accordance with the voltage Vio supplied to the power source line. Note that the power source switching control circuit SC may be configured as a processor including a CPU (central processing unit), an FPGA (field programmable gate array), or the like. The power source switching control circuit SC may operate in accordance with a program stored in a non-illustrated memory and control each component. Alternatively, some or all functions of the power source switching control circuit SC may be implemented by hardware electronic circuits. For example, the power source switching control circuit SC may determine a voltage state of the power source line, through which the voltage Vio is applied, by monitoring the power source line and may generate the breakdown voltage exceeding determination signal S0, the power supply determination signal S1, and the breakdown voltage non-exceeding determination signal S2 in accordance with a result of the determination.

The breakdown voltage exceeding determination signal S0 is at the "H" level when power source voltage that potentially exceeds the element breakdown voltage is input, in other words, when the voltage VioH is input. The breakdown voltage exceeding determination signal S0 is at the "L" level when power source voltage corresponding to the element breakdown voltage (power source voltage equivalent to the element breakdown voltage), for example, power source voltage equal to or lower than the element breakdown voltage is input, in other words, when the voltage VioL is input. The breakdown voltage exceeding determination signal S0 is at the "L" level even when the voltage Vio is not supplied to the power source line.

The power supply determination signal S1 is at the "H" level when the voltage Vio is supplied to the power source line. The power supply determination signal S1 is at the "L" level when the voltage Vio is not supplied to the power source line.

The breakdown voltage non-exceeding determination signal S2 is at the "H" level when power source voltage equivalent to the element breakdown voltage is input, in other words, when the voltage VioL is input. The breakdown voltage non-exceeding determination signal S2 is at the "L" level when power source voltage that potentially exceeds the element breakdown voltage is input, in other words, when the voltage VioH is input. Note that the breakdown voltage non-exceeding determination signal S2 may be an inversion signal of the breakdown voltage exceeding determination signal S0.

The transistor MP0 provided on the second path between the power source line and the node N1 has a source and a back gate connected with the power source line, has a drain connected with a source of the transistor MPY, and has a gate to which the breakdown voltage exceeding determination signal S0 is provided. The transistor MPY has a drain and a back gate connected with the node N1, has a gate to which voltage at a connection point between a drain of a transistor MP1 and a drain of a transistor MN5 is applied.

A current path of the PMOS transistor MP1 and a current path of the NMOS transistor MN5 are connected in series between the node N1 and the ground. The transistor MP1 has a source and a back gate connected with the node N1, has a drain connected with the drain of the transistor MN5, and has a gate to which the power supply determination signal S1 is provided. The transistor MN5 has a source and a back gate connected with the ground and has a gate to which the power supply determination signal S1 is provided. The transistors MP1 and MN5 each function as an inverter supplied with voltage from the node N1 and configured to invert the power supply determination signal S1. An output from the inverter is supplied from the connection point between the drain of the transistor MP1 and the drain of the transistor MN5 to the gate of the transistor MPY.

The transistor MN4 provided on the fifth path between the node N3 and the ground has a drain connected with the node N3, has a source connected with the drain of the transistor MN0, has a back gate connected with the ground, and has a gate to which the power supply determination signal S1 is provided. The transistor MN0 has a source and a back gate connected with the ground and has a gate to which the breakdown voltage non-exceeding determination signal S2 is provided.

The transistor MPX provided on the sixth path between the nodes N1 and N2 has a source and a back gate connected with the node N1, has a drain connected with the node N2, and has a gate to which the voltage Vio supplied to the power source line through a terminal I3 is applied. Note that, when the voltage Vio is not supplied to the power source line, the voltage Vio is not supplied to the terminal I3 as well.

Figure 6:
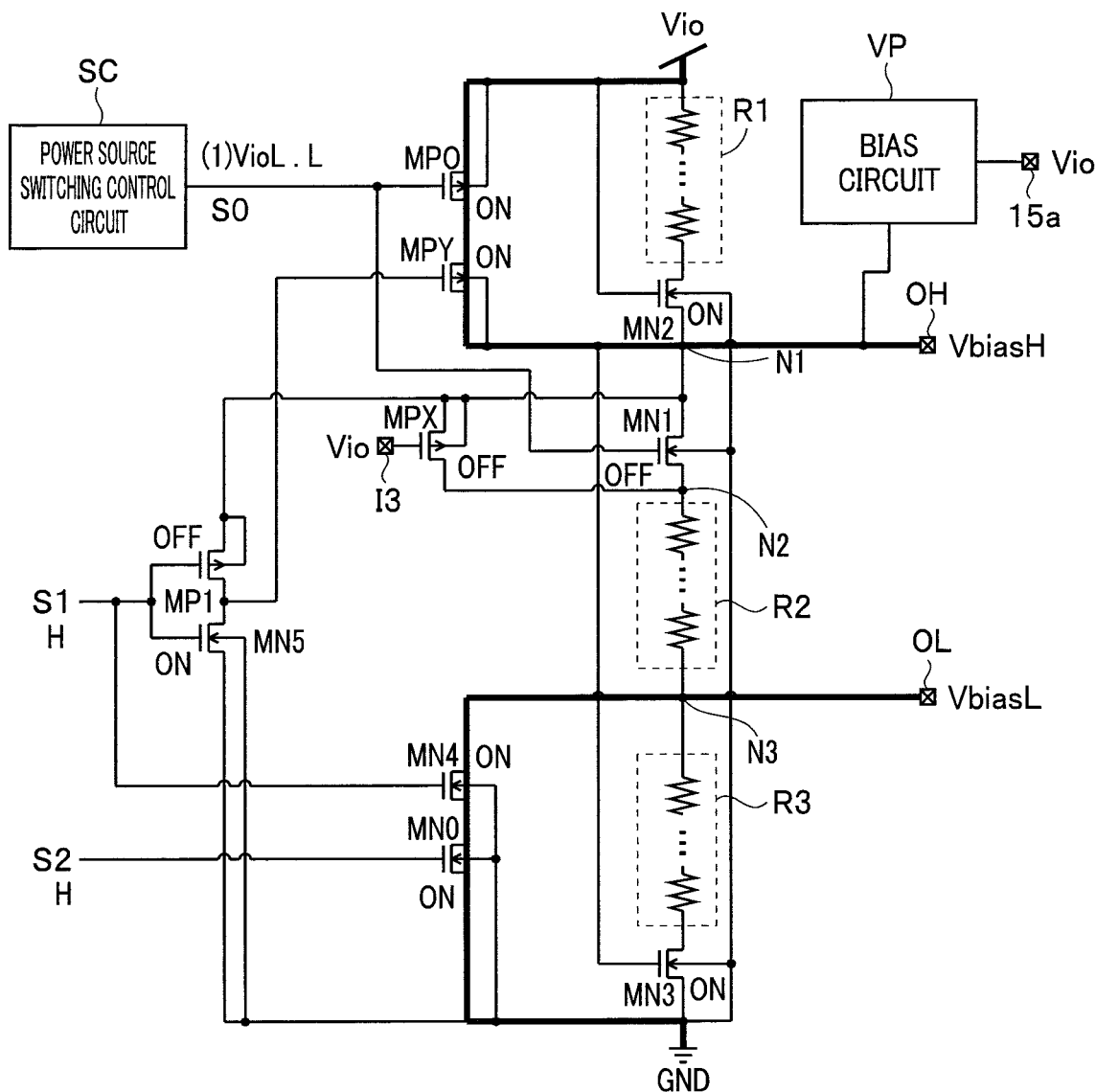
FIG. 6 is an explanatory diagram for description of operation of the embodiment.
Figure 7:
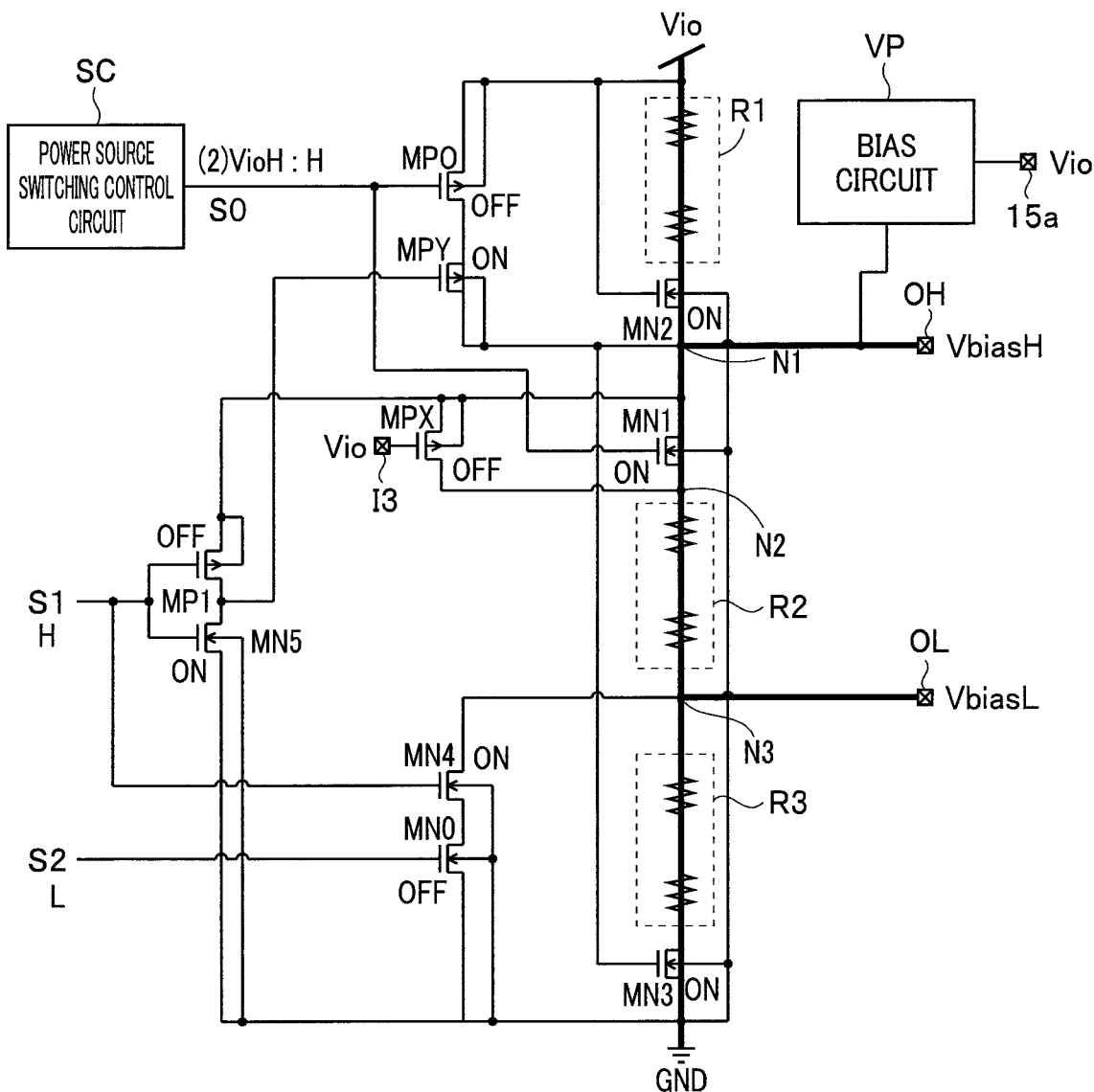
FIG. 7 is an explanatory diagram for description of operation of the embodiment.
Figure 8:
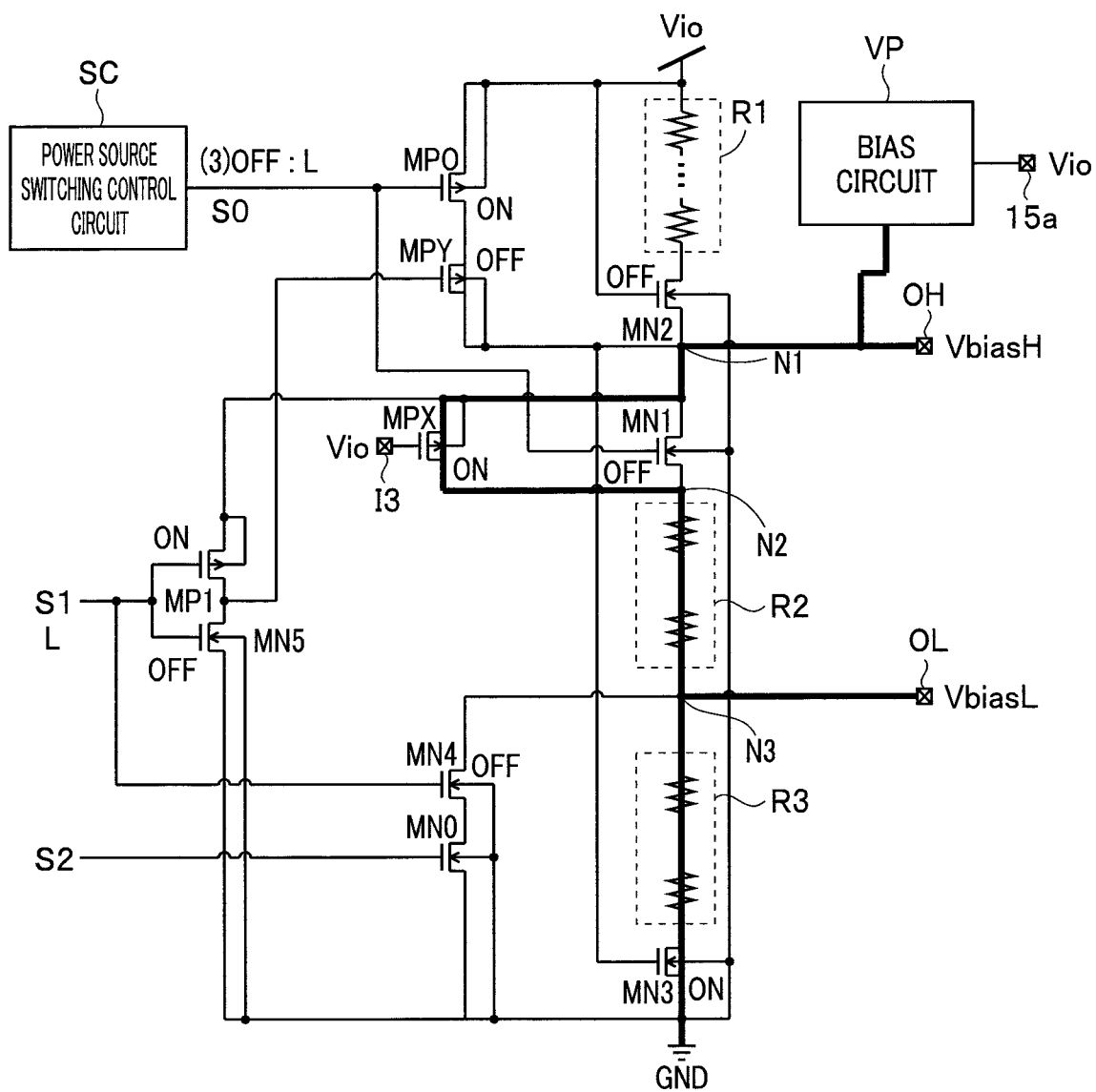
FIG. 8 is an explanatory diagram for description of operation of the embodiment.

Subsequently, operation of the embodiment configured as described above will be described with reference to FIGS. 6 to 8. FIGS. 6 to 8 are explanatory diagrams for description of the operation of the embodiment.

The power source voltage Vio is supplied from the host 2 to the host I/F circuit 15. The voltage generation circuit 20 in the host I/F circuit 15 generates the bias voltage Vbias by using the power source voltage Vio. The voltage generation circuit 20 generates the bias voltage Vbias by the processing described above in (1) to (3) to achieve a tolerant function under the above-described first and second constraint conditions.

Specifically, the power source switching control circuit SC determines, for example, the voltage state of the power source line and generates the determination signals S0 to S3 for executing the processing described above in (1) to (3). The breakdown voltage exceeding determination signal S0 is supplied to the transistors MP0 and MN1, the power supply determination signal S1 is supplied to the transistors MP1, MN5, and MN4, and the breakdown voltage non-exceeding determination signal S2 is supplied to the transistor MN0.

Case in which Voltage Equivalent to Element Breakdown Voltage is Supplied as Power Source Voltage When the voltage VioL is supplied to the power source line, the processing described above in (1) is performed. FIG. 6 is for description of a circuit state in this case. Specifically, in this case, the breakdown voltage exceeding determination signal S0 is at the "L" level, and the power supply determination signal S1 and the breakdown voltage non-exceeding determination signal S2 are at the "H" level. Since the breakdown voltage exceeding determination signal S0 is at the "L" level, the transistor MP0 is on and the transistor MN1 is off. In addition, the transistors MN2 and MN3 are on. Since the power supply determination signal S1 is at the "H" level, the "L" level is provided to the gate of the transistor MPY and the transistor MPY is turned on. Thus, as illustrated with a bold line in FIG. 6, the power source line is connected with the output terminal OH through the second path constituted by the current paths of the transistors MP0 and MPY. Since the transistor MP1 is off, no electricity is conducted through a wire from the output terminal OH to the ground. Thus, the voltage VioL supplied to the power source line is output as the bias voltage VbiasH from the output terminal OH.

Since the determination signals S1 and S2 are both at the "H" level, the transistors MN0 and MN4 are on. Thus, as illustrated with a bold line in FIG. 6, the output terminal OL is connected with the ground through the current paths of the transistors MN4 and MN0 (the fifth path). Thus, the bias voltage VbiasL at the ground level is output from the output terminal OL.

In this manner, the processing described above in (1) is performed.

Case in which Voltage that Exceeds Element Breakdown Voltage is Potentially Supplied as Power Source Voltage When the voltage VioH is supplied to the power source line, the processing described above in (2) is performed. FIG. 7 is for description of a circuit state in this case. Specifically, in this case, the breakdown voltage exceeding determination signal S0 and the power supply determination signal S1 are at the "H" level, and the breakdown voltage non-exceeding determination signal S2 is at the "L" level. Since the breakdown voltage exceeding determination signal S0 is at the "H" level, the transistor MP0 is off and the transistor MN1 is on. In addition, the transistors MN2 and MN3 are on. Thus, as illustrated with a bold line in FIG. 7, the power source line is connected with the ground through the resistance circuit R1, the current path of the transistor MN2, the current path of the transistor the resistance circuit R2, the resistance circuit R3, and the current path of the transistor MN3.

Since the power supply determination signal S1 is at the "H" level, the transistor MPY is on. However, since the transistor MP0 is off, no electricity is conducted through the second path from the power source line to the node N1 through the current paths of the transistors MP0 and MPY. Since the transistor MN5 is on but the transistor MP1 is off, no electricity is conducted through the wire from the output terminal OH to the ground.

Since the power supply determination signal S1 is at the "H" level, the transistor MN4 is on. However, since the breakdown voltage non-exceeding determination signal S2 is at the "L" level, the transistor MN0 is off, and accordingly, no electricity is conducted through the fifth path between the output terminal OL and the ground through the current paths of the transistors MN4 and MN0.

Thus, voltage at the node N1 has a voltage value obtained through resistive division of the voltage VioH based on the ratio of the resistance value of the resistance circuit R1 and the resistance value of combined resistance of the resistance circuits R2 and R3. Voltage at the node N3 has a voltage value obtained through resistive division of the voltage VioH based on the ratio of the resistance value of combined resistance of the resistance circuits R1 and R2 and the resistance value of the resistance circuit R3. Thus, the bias voltages Vbias and VbiasL that do not exceed the element breakdown voltage can be output from the output terminals OH and OL, respectively, by setting each of the resistance values of the resistance circuits R1 to R3 as appropriate.

In this manner, the processing described above in (2) is performed.

Case of Original Power Source Voltage Cutoff

When the voltage Vio is not supplied to the power source line but is supplied to the terminal 15a, the processing described above in (3) is performed. FIG. 8 is for description of a circuit state in this case. Specifically, in this case, the bias circuit VP supplies, to the output terminal OH (node N1), voltage generated through resistive division as the voltage Vio is supplied from the terminal 15a.

The breakdown voltage exceeding determination signal S0 and the power supply determination signal S1 are at the "L" level. Thus, the transistor MP0 is on. However, the power supply determination signal S1 is inverted by the inverter of the transistors MP1 and MN5 and supplied to the gate of the transistor MPY, and the transistor MPY is off. Since the transistor MN2 is off as well, no electricity is conducted through wires (the first and second paths) from the node N1 to the power source line. Since the transistor MN5 is off, no electricity is conducted through a path from the node N1 to the ground through the transistors MP1 and MN5.

Since the power supply determination signal S1 is at the "L" level, the transistor MN4 is off, and accordingly, no electricity is conducted through the fifth path from the node N3 to the ground through the current paths of the transistors MN4 and MN0.

Since the breakdown voltage exceeding determination signal S0 is at the "L" level, the transistor MN1 is off. However, in the present embodiment, since the voltage Vio is not applied to the terminal I3, the transistor MPX is on. Thus, the nodes N1 and N2 are connected with each other through the current path of the transistor MPX (the sixth path). Since the transistor MN3 is on, the node N1 and the ground are connected with each other through the current path of the transistor MPX, the resistance circuit R2, the resistance circuit R3, and the current path of the transistor MN3.

Accordingly, the voltage generated by the bias circuit VP is supplied to the output terminal OH. Voltage obtained through resistive division of voltage appearing at the output terminal OH based on a ratio of the resistance value of the resistance circuit R2 and the resistance value of the resistance circuit R3 is supplied to the output terminal OL. No voltage that exceeds the breakdown voltage of each element in the host I/F circuit 15 is supplied from the voltage generation circuit 20 by setting the voltage dividing resistance of the bias circuit VP and the resistance values of the resistance circuits R2 and R3 as appropriate. Moreover, no current flows to the power source line through the first and second paths due to the voltage generated by the bias circuit VP. In this manner, the processing described above in (3) is performed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A voltage generation circuit comprising:
    a plurality of resistance circuits each consisting of a plurality of resistor elements connected in series;
    a first current path disposed in parallel with a first resistance circuit of the plurality of resistance circuits between a first node connected to a power source line configured to supply a first voltage and a second node between the first resistance circuit and a second resistance circuit of the plurality of resistance circuits;
    a second current path disposed in parallel with a third resistance circuit of the plurality of resistance circuits between a third node different from the second node and a fourth node connected to a ground configured to supply a second voltage;
    a bias circuit to which a third voltage is supplied and connected to the second node;
    a first output terminal connected to the second node;
    a second output terminal connected to the third node; and
    a switching circuit configured to switch connection of the first current path and the second current path based on the first voltage, the second voltage and the third voltage, and to control conduction between the second node and the first resistance circuit.

2. The voltage generation circuit according to claim 1, wherein
    when a voltage equal to or lower than an element breakdown voltage is supplied as the first voltage, the switching circuit is configured to:
        provide the first voltage to the first output terminal through the first current path; and
        execute first processing of conducting no electricity between the second node and the second resistance circuit and providing the second voltage to the second output terminal through the second current path.

3. The voltage generation circuit according to claim 1, wherein
    when a voltage that exceeds an element breakdown voltage is supplied as the first voltage, the switching circuit is configured to:
        cut off the first current path and the second current path and conduct electricity between the second node and the first resistance circuit; and
        execute second processing of providing, to the first output terminal and the second output terminal, a voltage obtained by resistively dividing a voltage based on the first voltage and the second voltage by the first to third resistance circuits.

4. The voltage generation circuit according to claim 1, wherein
    when the first voltage is not supplied but the third voltage is supplied, the switching circuit is configured to:
        cut off the first current path and the second current path and conduct no electricity between the second node and the first resistance circuit; and
        execute second processing of providing a voltage generated by the bias circuit based on the third voltage to the first output terminal, and providing, to the second output terminal, a voltage obtained by resistively dividing a voltage based on the voltage generated by the bias circuit and the second voltage by the second and third resistance circuits.

5. The voltage generation circuit according to claim 1, wherein the switching circuit is configured to:
    cut off conduction of the first and second current paths by a first determination signal indicating that the first voltage is not supplied;
    perform conduction control of the first current path by a second determination signal indicating that a voltage equal to or lower than an element breakdown voltage is supplied as the first voltage; and
    perform conduction control of the second current path by a third determination signal indicating that a voltage equal to or lower than the element breakdown voltage is supplied as the first voltage.

6. A semiconductor device comprising:
    the voltage generation circuit according to claim 1; and
    an interface circuit that includes a processing circuit configured to communicate data with a host and in which a power source voltage is supplied from the voltage generation circuit to an element in the processing circuit.

* * * * *